United States Patent
Lee et al.

(10) Patent No.: US 10,961,119 B1
(45) Date of Patent: Mar. 30, 2021

(54) MEMS DEVICE WITH STICTION RECOVER AND METHODS

(71) Applicant: mCube, Inc., San Jose, CA (US)

(72) Inventors: Shih-Wei Lee, San Jose, CA (US); Wen-Chih Chen, San Jose, CA (US)

(73) Assignee: mCube, Inc., San Jose, CA (US)

( * ) Notice: Subject to any disclaimer, the term of this patent is extended or adjusted under 35 U.S.C. 154(b) by 297 days.

(21) Appl. No.: 15/877,999

(22) Filed: Jan. 23, 2018

(51) Int. Cl.
  *B81C 1/00* (2006.01)
  *G01P 15/08* (2006.01)
  *G01P 15/125* (2006.01)
  *B81B 7/00* (2006.01)

(52) U.S. Cl.
  CPC .......... *B81C 1/00976* (2013.01); *B81B 7/008* (2013.01); *G01P 15/0802* (2013.01); *G01P 15/125* (2013.01); *B81B 2201/0235* (2013.01); *B81B 2207/03* (2013.01); *G01P 2015/0874* (2013.01)

(58) Field of Classification Search
  CPC ............ B81C 1/00976; B81C 1/00984; B81C 1/00968; G01P 15/0802; G01P 15/125; G01P 2015/0874; B81B 7/008; B81B 2201/0235; B81B 2207/03
  USPC .............. 73/514.35, 504.02–504.18, 514.01, 73/514.02, 514.15–514.27, 73/514.29–514.38, 861.354–861.357
  See application file for complete search history.

(56) References Cited

U.S. PATENT DOCUMENTS

| | | | |
|---|---|---|---|
| 9,517,930 B2 * | 12/2016 | Cazzaniga | B81C 1/00968 |
| 2012/0280591 A1 * | 11/2012 | Schultz | B81B 3/0016 310/300 |
| 2014/0345380 A1 * | 11/2014 | Jia | B81B 3/0016 73/514.32 |

* cited by examiner

*Primary Examiner* — Robert R Raevis
(74) *Attorney, Agent, or Firm* — Richard T. Ogawa; Ogawa P.C.

(57) ABSTRACT

A MEMS device comprising a substrate comprising a die and a plurality of side-walls disposed upon the MEMS die, a proof-mass coupled to the substrate, the proof-mass is configured to be displaced within a first plane that is parallel to the die, wherein the proof-mass is configured to contact at least a sidewall, wherein the proof-mass is configured to adhere to the side-wall as a result of stiction forces, a driving circuit configured to provide a driving voltage in response to a driving signal indicating that the proof-mass is adhered to the side-wall, and an actuator coupled to the driving circuit disposed upon the side-wall, wherein the actuator is configured to receive a driving voltage and to provide an actuator force to the proof mass within the first plane in a direction away from the side-wall in response to the driving voltage, wherein the actuator force exceeds the stiction forces.

20 Claims, 3 Drawing Sheets

MEMS DEVICE WITH STICTION RECOVER AND METHODS

BACKGROUND OF THE INVENTION

The present invention relates to MEMS devices. More specifically, the present invention relates to overcoming stiction within MEMS devices.

The inventors of the present invention have recognized that portions of their MEMS devices may suffer from stiction forces causing erroneous output of data (e.g. accelerometer data). One current method for overcoming stiction forces is to subject the MEMS device (e.g. phone, watch, activity sensor) to a sharp force or tap to dislodge the components. Such a solution is not practical, as it requires user to determine that the MEMS device is stuck and requires the user to hit the device.

In light of the above, what is desired are improved methods and apparatus to address the problem described above with reduced drawbacks.

BRIEF SUMMARY OF THE INVENTION

The present invention is directed to integrated MEMS (Micro-Electro-Mechanical-Systems) IC (Integrated Circuit) devices. More specifically, embodiments of the invention provide a method and structure of a MEMS device with stiction recovery.

Embodiments of the present invention take advantage of electro-thermal actuation to overcome stiction forces in MEMS devices. In some cases, using thermal actuators, high output force and large displacement can be achieved even with a low driving voltage. In addition, due to the high output efficiency, the actuators may be slim in size. In some embodiments, the driving signal may be within a range of sub-volts to several volts (e.g. 0.5 volts to 2 volts, etc.); the actuator force may be within a range of microNewtons to milliNewtons (e.g. 10 to 50 microNewtons, 25 to 40 microNewtons, etc.); a length of an actuator may be within a range of tens of microns to hundreds of microns (e.g. 50 microns to 200 microns, 40 microns to 300 microns, etc); and a width of an actuator may be within a range of several microns (e.g. 1 micron to 10 microns, 2 to 5 microns, etc.). Further, in some embodiments may be incorporated into the MEMS device.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1:
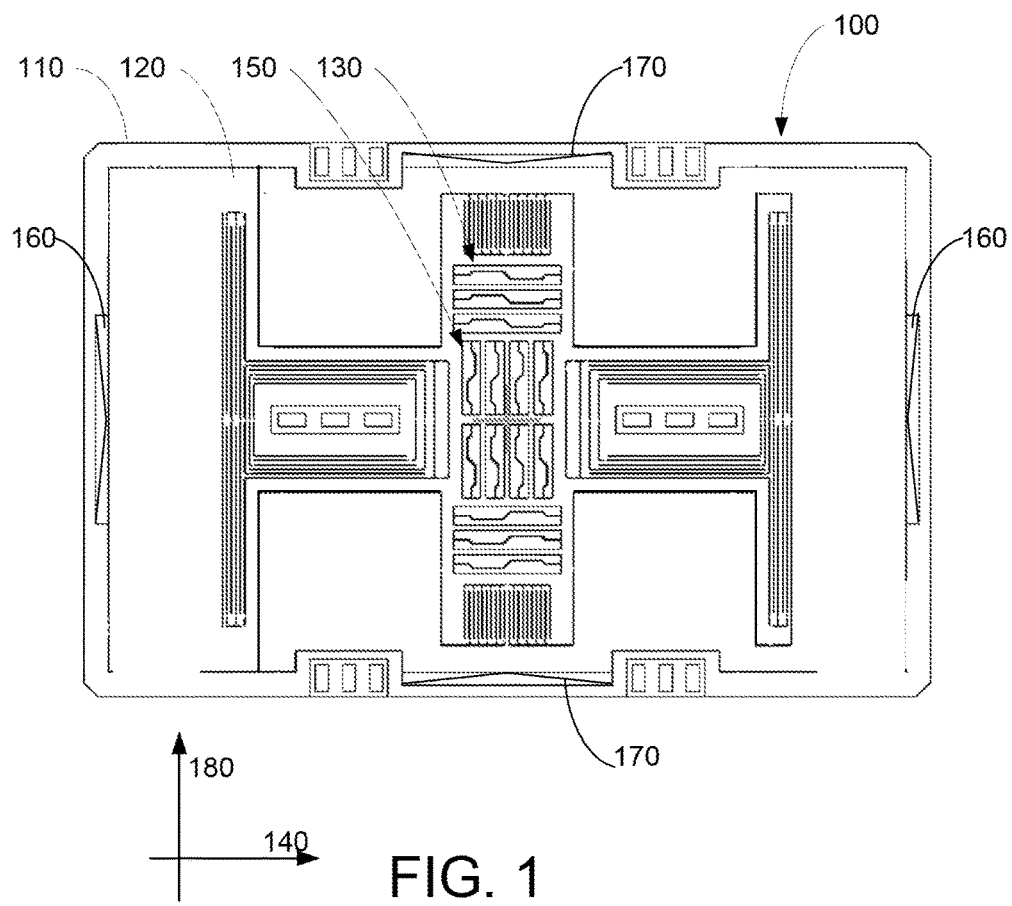
FIG. 1 illustrates a configuration of embodiments of MEMS devices.

FIG. 1 illustrates an embodiment of the present invention. More specifically, FIG. 1 illustrates a top view of a typical MEMS accelerometer device 100. Device 100 includes an outer region (e.g. sidewall) 110 and a proof-mass region 120. Device 100 also includes a plurality of sensing regions (e.g. capacitor plates) 130 that are used to sense motion of proof-mass region 120 in an x-direction 140, and a plurality of sensing regions (e.g. capacitor plates) 150 that are used to sense motion of proof-mass region 120 in a y-direction 180. In various embodiments, device 100 typically includes a CMOS substrate including a plurality of CMOS control circuitry. Embodiments may be implemented based upon MEMS devices provided by mCube, Inc., the assignee of the present application.

In FIG. 1, outer region 110 includes a number of actuators, including x-direction actuators 160 and y-direction actuators 170. In some embodiments of the present invention, actuators 160 and 170 may have a physical beam length of about 100 microns by a physical beam width of about 3 microns. It should be understood that in other embodiments, other lengths and widths for a thermal actuator may also be used, depending upon amount of force required, upon power considerations, upon thermal considerations, and the like. Additionally, an actuator beam incline angle is within a range of about 1 degree to about 10 degrees.

Figures 2A, 2B, 2C:
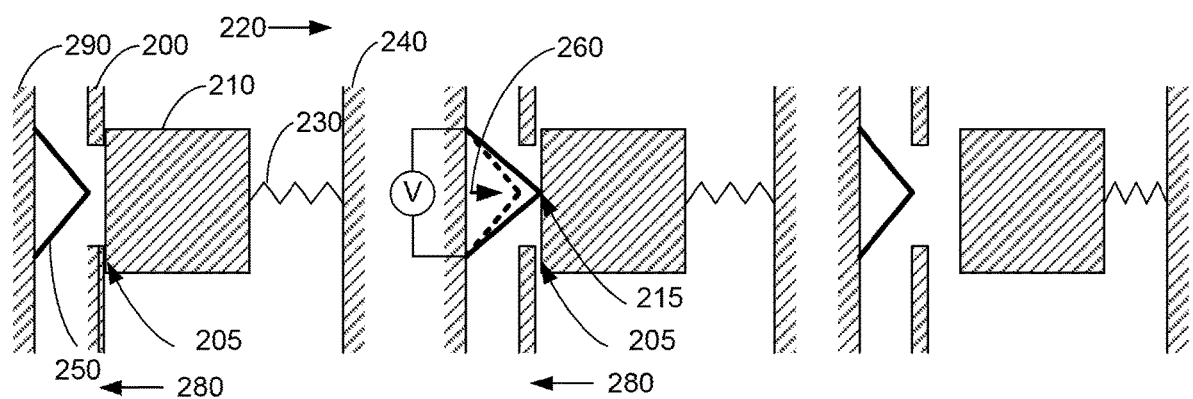
FIGS. 2A-C illustrate various configurations of embodiments.

FIGS. 2A-C illustrate operation of an actuator according to embodiments of the present invention. More specifically, FIGS. 2A-C illustrate a portion 200 of a sidewall and a portion of a proof-mass 210. In this example, proof-mass 210 is subject to a restoring force 220 via a spring 230 or the like that is coupled to an anchor point 240, e.g. the substrate of the MEMS device. An actuator 250 is also provided coupled to another portion 290 of the sidewall.

In FIG. 2A, a first portion 205 of proof-mass 210 touches portion 200 of the sidewall and is adhered thereto via electrostatic forces, stiction forces 280, or the like. In response to a detection of this stuck position, power is applied to actuator 250. In various embodiments, detection of a stuck position may be performed on-board the MEMS accelerometer device using the CMOS circuitry. Additionally, powering of actuator 250 may also be provided by the CMOS circuitry.

As illustrated in FIG. 2B, actuator 250 creates a force 260 responsive to the applied power. In various embodiments, force 260 is applied to a second portion 215 and is designed to overcome the stiction force 280, depending upon the specific embodiment. As illustrated, first portion 205 is adjacent to second portion 215. In FIG. 2C, when force 260 overcomes stiction force 280, first portion 205 of proof-mass 210 is freed from portion 200. In various embodiments, force 260 may be provided by actuator 250 within a controlled amount of time. Accordingly, the impulse of force 260 may be adjusted according to engineering requirements.

In various embodiments, actuator 250 may be used as actuators 160 and 170 in FIG. 1. In one specific embodiment, stiction force is estimated to be within a range of 20 to 40 microNewtons (e.g. 35 microNewtons), whereas force 270 is designed to overcome the stiction force (e.g. within a range of 25 to 45 microNewtons), depending upon the specific design.

Figure 3:
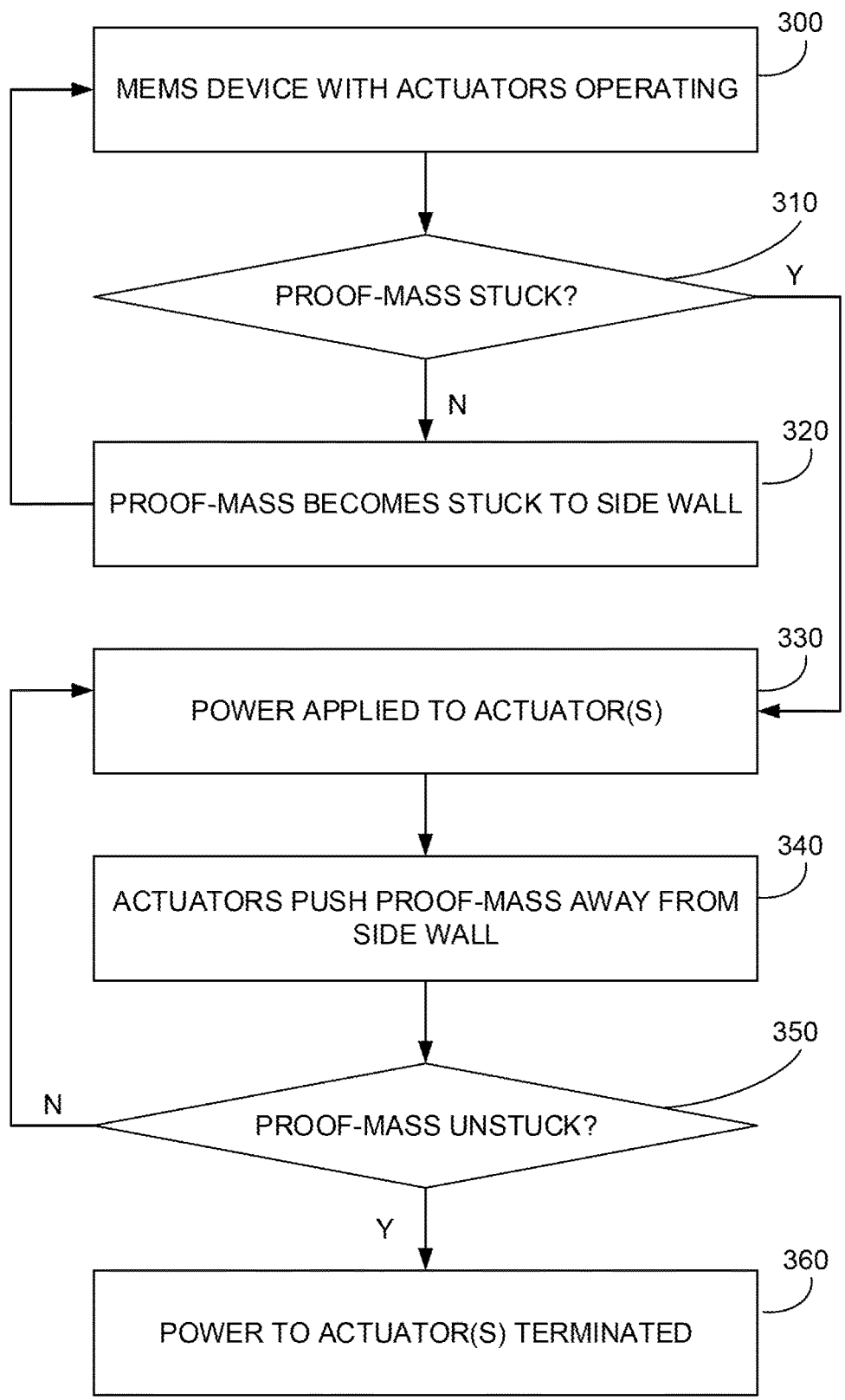
FIG. 3 illustrates an embodiment of the present invention.

FIG. 3 illustrates a block diagram according to various embodiments of the present invention. Initially, the MEMS device is provided with one or more actuators, described above and the MEMS device is operating properly, step 300. A sensor within the MEMS device may then electrically determine that the proof-mass is stuck, step 310. Subsequently, due to one or more external perturbations (e.g.

physical displacements) of the MEMS device, a proof-mass may become stuck to a sidewall due to stiction forces, or the like, step 320.

When the determination is made that the proof-mass is stuck, a control with the MEMS device applies power to one or more actuators, step 330. In response to the applied power, the one or more actuators change their physical shape, and push the proof-mass away from the sidewalls, step 340. When the sensor within the MEMS device determines that the proof-mass has been freed, step 350, power may be withdrawn from the one or more actuators, step 360.

Figure 4:
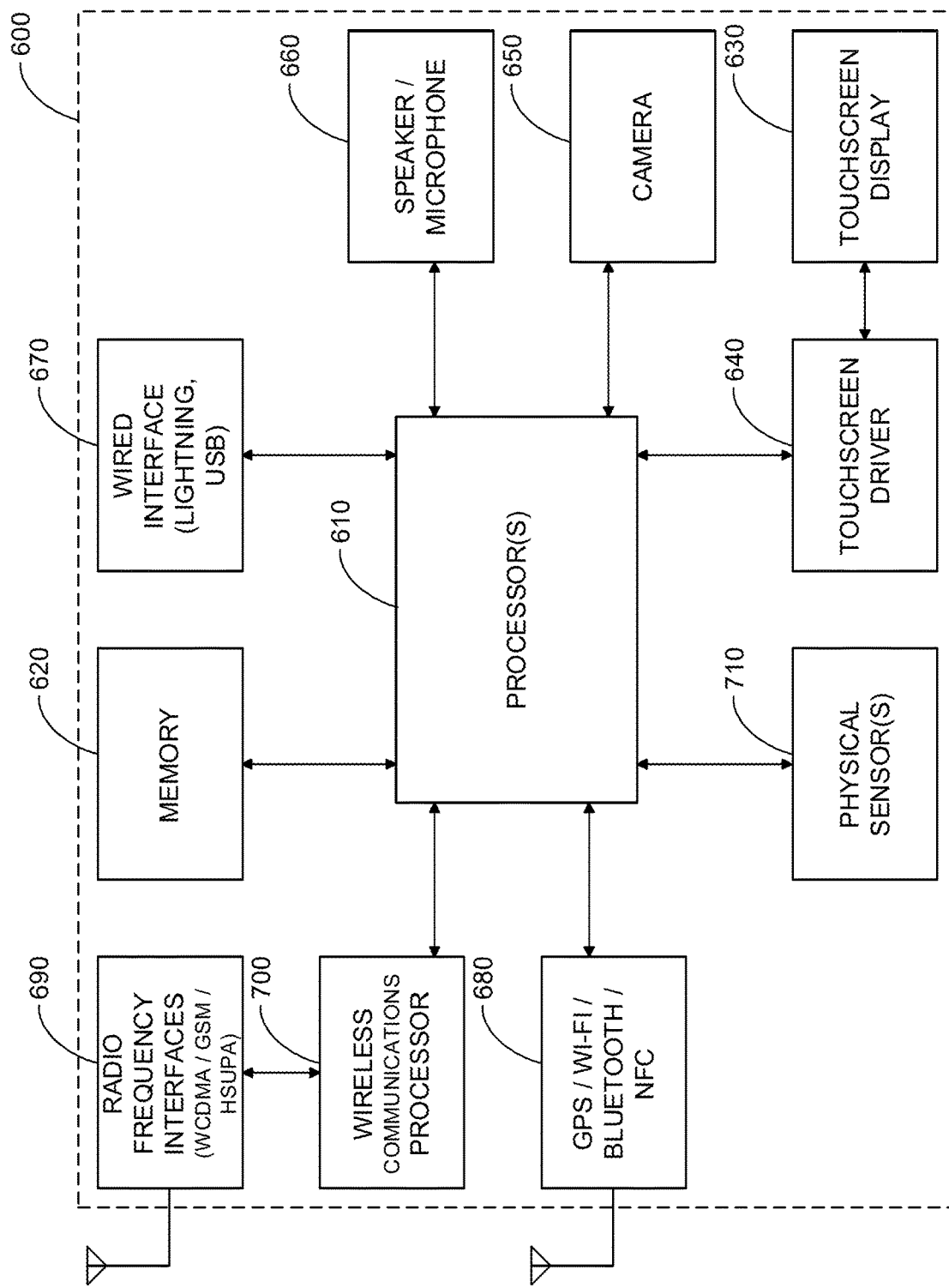
FIG. 4 illustrates a functional block diagram of various embodiments of the present invention.

FIG. 4 illustrates a functional block diagram of various embodiments of the present invention. More specifically, FIG. 4 illustrates a system including embodiments of the present invention. In FIG. 4, a computing device 600 typically includes some or all of the following: an applications processor 610, memory 620, a touch screen display 630 and driver 640, an image acquisition device 650, audio input/output devices 660, a power supply (e.g. battery) and the like. Additional communications from and to computing device may be provided by via a wired interface 670, a GPS/Wi-Fi/Bluetooth interface 680, RF interfaces 690 and driver 700, and the like. Also included in various embodiments are physical sensors 710.

In various embodiments, computing device 600 may be a hand-held computing device (e.g. Android tablet, Apple iPad), a smart phone (e.g. Apple iPhone, Google Nexus, Samsung Galaxy S), a portable computer (e.g. netbook, laptop, ultrabook), a media player, a reading device (e.g. Amazon Kindle), a wearable device (e.g. Apple Watch, Android watch, FitBit device, or other wearable device), or the like.

Typically, computing device 600 may include one or more processors 610. Such processors 610 may also be termed application processors, and may include a processor core, a video/graphics core, and other cores. Processors 610 may be a processor from Apple (e.g. A9), Qualcomm (Snapdragon), or the like. In other embodiments, the processor core may be an Intel processor, an ARM Holdings processor such as the Cortex or ARM series processors, or the like. Further, in various embodiments, the video/graphics core may be an ARM processor, Imagination Technologies processor PowerVR graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 620 may include different types of memory (including memory controllers), such as flash memory (e.g. NOR, NAND), pseudo SRAM, DDR SDRAM, or the like. Memory 620 may be fixed within computing device 600 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, a touch screen display 630 and driver 640 may be provided and based upon a variety of later-developed or current touch screen technology including: resistive displays, capacitive displays, optical sensor displays, or the like. Additionally, touch screen display 630 may include single touch or multiple-touch sensing capability. Any later-developed or conventional output display technology may be used for the output display, such as TFT-LCD, OLED, Plasma, electronic ink (e.g. electrophoretic, electrowetting, interferometric modulating), or the like. In various embodiments, the resolution of such displays and the resolution of such touch sensors may be set based upon engineering or non-engineering factors (e.g. sales, marketing). In some embodiments of the present invention, a display output port, such as an HDMI-based port, DVI-based port, or the like may also be included.

In some embodiments of the present invention, image capture device 650 may be provided and include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, proximity detection, or the like.

In various embodiments, audio input/output 660 may be provided and include microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 610 to enable the user to operate computing device 600 by stating voice commands. Additionally, a speech engine may be provided in various embodiments to enable computing device 600 to provide audio status messages, audio response messages, or the like.

In various embodiments, wired interface 670 may be used to provide data transfers between computing device 600 and an external source, such as a computer, a remote server, a storage network, another computing device 600, or the like. Such data may include application data, operating system data, firmware, or the like. Embodiments may include any later-developed or conventional physical interface/protocol, such as: USB, micro USB, mini USB, Firewire, Apple Lightning connector, Ethernet, POTS, or the like. Additionally, software that enables communications over such networks is typically provided.

In various embodiments, a wireless interface 680 may also be provided to provide wireless data transfers between computing device 600 and external sources, such as computers, storage networks, headphones, microphones, cameras, or the like. As illustrated in FIG. 8, wireless protocols may include Wi-Fi (e.g. IEEE 802.11 a/b/g/n, WiMax), Bluetooth, IR, near field communication (NFC), ZigBee, ZWave, and the like.

GPS receiving capability may also be included in various embodiments of the present invention, however is not required. As illustrated in FIG. 8, GPS functionality is included as part of wireless interface 680 merely for sake of convenience, although in implementation, such functionality is currently performed by circuitry that is distinct from the Wi-Fi circuitry and distinct from the Bluetooth circuitry.

Additional wireless communications may be provided via RF interfaces 690 and drivers 700 in various embodiments. In various embodiments, RF interfaces 690 may support any future-developed or conventional radio frequency communications protocol, such as CDMA-based protocols (e.g. WCDMA), GSM-based protocols, HSUPA-based protocols, or the like. In the embodiments illustrated, driver 700 is illustrated as being distinct from applications processor 610.

However, in some embodiments, these functionality are provided upon a single IC package, for example the Marvel PXA330 processor, and the like. It is contemplated that some embodiments of computing device 600 need not include the RF functionality provided by RF interface 690 and driver 700.

FIG. 4 also illustrates computing device 600 to include physical sensors 710. In various embodiments of the present invention, physical sensors 710 are multi-axis Micro-Electro-Mechanical Systems (MEMS) based devices being developed by m-Cube, the assignee of the present patent application. Such sensors typically include very low power three-axis sensors (linear, gyro or magnetic); ultra-low jitter three-axis sensors (linear, gyro or magnetic); low cost six-axis motion sensor (combination of linear, gyro, and/or magnetic); ten-axis sensors (linear, gyro, magnetic, pressure); and various combinations thereof.

FIG. 4 is representative of one computing device 600 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 8. For example, in various embodiments, computing device 600 may lack one or more of the above functional blocks, such as image acquisition unit 650, or RF interface 690 and/or driver 700, or GPS capability, or the like. Additional functions may also be added to various embodiments of computing device 600, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

We claim:

1. A device comprising:
a substrate comprising a die and a plurality of side-walls disposed upon the die;
a proof-mass coupled to the substrate comprising sensing regions, wherein the proof-mass is configured to be displaced within a first plane that is parallel to the die, wherein a first portion of the proof-mass is configured to contact at least a side-wall from the plurality of side-walls, wherein the first portion of the proof-mass is configured to adhere to the side-wall as a result of stiction forces;
a driving circuit configured to provide a driving voltage in response to a driving signal indicating that the proof-mass is adhered to the side-wall; and
an actuator coupled to the driving circuit, wherein the actuator is configured to receive the driving voltage, wherein the actuator is configured to extend, to contact and to physically push a second portion of the proof mass within the first plane in a direction away from the side-wall in response to the driving voltage, wherein a force of the push exceeds the stiction forces, and wherein the first portion of the proof-mass is immediately adjacent to the second portion of the proof-mass.

2. The device of claim 1
wherein the substrate comprises a plurality of sensors;
wherein the proof-mass comprises a plurality of structures coupled to the plurality of sensors;
wherein the device further comprises a sensing circuit coupled to the plurality of sensors, wherein the sensing circuit is configured to determine orientation of the plurality of structures relative to the plurality of sensors with respect to time.

3. The device of claim 2 further comprising:
a determination circuit coupled to the sensing circuit and to the driving circuit, wherein the determination circuit is configured to provide the driving signal indicating that the proof-mass is adhered to the side-wall in response to the orientation of the plurality of structures relative to the plurality of sensors with respect to time.

4. The device of claim 1 wherein the driving voltage is within a range of sub-volts to 2 volts.

5. The device of claim 1 wherein the actuator is characterized by a length within a range of tens of microns to hundreds of microns and a width within a range of one to ten microns.

6. The device of claim 1 wherein the force the push is within a range of to 25 to 40 microNewtons.

7. The device of claim 1 wherein the actuator is disposed with a center of the side-wall.

8. The device of claim 1
wherein a portion of the actuator is configured to be physically displaced by a distance sufficient to separate the proof-mass from being in contact with the sidewall in response to the driving voltage.

9. The device of claim 1
wherein the proof-mass is configured to contact at least another sidewall from the plurality of side-walls, wherein the proof-mass is configured to adhere to the other side-wall as a result of stiction forces;
wherein the device further comprises another actuator coupled to the driving circuit, wherein the other actuator is disposed upon the other side-wall, wherein the other actuator is configured to receive the driving voltage, wherein the other actuator is configured to extend, to contact and to physically push the proof mass within the first plane in another direction away from the other side-wall in response to the driving voltage, wherein a force of the push exceeds the stiction forces.

10. The device of claim 9 wherein the direction of the actuator and the other direction of the other actuator are related in a manner selected from a group consisting of: orthogonal and opposite.

11. A method for device having a substrate, a proof mass and sensing regions comprising:
detecting that a first portion of the proof mass is adhered to a sidewall of the substrate due to stiction forces;
providing a driving signal to an actuator in response to the detecting that the first portion of the proof mass is adhered to the sidewall of the substrate;
providing an actuator force from the actuator to a second portion of the proof mass in response to the driving signal to thereby free the first portion proof mass from being adhered to the sidewall of the substrate, wherein a direction of the actuator force is in a direction opposite of the stiction forces, and wherein the second portion of the proof mass is immediately adjacent to the first portion of the proof mass; and wherein providing the actuator force is associated with a portion of the actuator being physically displaced by a distance sufficient to separate the proof-mass from being in contact with the first portion of the sidewall in response to the driving signal.

12. The method of claim 11 further comprising determining orientation of the proof-mass relative to the substrate with respect to time within a plane parallel to the substrate.

13. The method of claim 12 wherein the detecting that the proof mass is adhered to the first portion of the sidewall of the substrate due to stiction forces is in response to the orientation of the proof-mass relative to the substrate with respect to time.

14. The method of claim 11 wherein the driving signal is within a range of sub-volts to 2 volts.

15. The method of claim 11 wherein the force of the push is within a range of 25 to 40 microNewtons.

16. The method of claim 11
wherein the proof-mass is associated with an accelerometer.

17. The method of claim 11 further comprising:
detecting that the proof mass is adhered to a first portion of another sidewall of the substrate due to other stiction forces;
providing another driving signal to another actuator in response to the detecting that the proof mass is adhered to a second portion of the other sidewall of the substrate;
providing another actuator force from the other actuator disposed upon the second portion of the other sidewall in response to the other driving signal to thereby free the proof mass from being adhered to the first portion of the other sidewall of the substrate, wherein another direction of the other actuator force is in a direction opposite of the other stiction forces.

18. The method of claim 17 wherein the direction of the actuator and the other direction of the other actuator are related in a manner selected from a group consisting of: orthogonal and opposite.

19. The method of claim 18 wherein the direction and the other direction are co-planar.

20. The method of claim 12 wherein the determining orientation of the proof-mass relative to the substrate with respect to time comprises determining with the sensing regions the orientation of the proof-mass relative to the substrate with respect to time within the plane parallel to the substrate.

* * * * *